United States Patent [19]
Tai

[11] Patent Number: 5,745,423
[45] Date of Patent: Apr. 28, 1998

[54] LOW POWER PRECHARGE CIRCUIT FOR A DYNAMIC RANDOM ACCESS MEMORY

[75] Inventor: Jy-Der David Tai, Hsinchu, Taiwan

[73] Assignee: Powerchip Semiconductor Corp., Hsinchu, Taiwan

[21] Appl. No.: 768,986

[22] Filed: Dec. 17, 1996

[51] Int. Cl.$^6$ .................................................. G11C 7/00
[52] U.S. Cl. ........................... 365/203; 365/205; 365/207
[58] Field of Search ................................. 365/203, 207, 365/208, 205

[56] References Cited

U.S. PATENT DOCUMENTS

| 5,426,603 | 6/1995 | Nakamura et al. | 365/203 |
| 5,463,584 | 10/1995 | Hoshino | 365/203 |
| 5,544,110 | 8/1996 | Yuh | 365/205 |
| 5,646,880 | 7/1997 | Yuh | 365/149 |

*Primary Examiner*—David C. Nelms
*Assistant Examiner*—Hoai V. Ho
*Attorney, Agent, or Firm*—Ladas & Parry

[57] ABSTRACT

A low power precharge circuit for a dynamic random access memory (DRAM) is disclosed. The present invention includes an equalization circuit connected to a pair of bitlines for allowing electric charge of the bitline having higher voltage to flow to the bitline having lower voltage after being activated by a precharge control signal. A voltage pull circuit is used to provide a constant voltage in response to a first sense control signal. Further, a voltage amplifying circuit connected to the pair of bitlines is used to amplify the voltages of the bitlines in response to a second sense control signal so that the voltage of one bitline is complementary to the voltage of the other bitline.

18 Claims, 5 Drawing Sheets

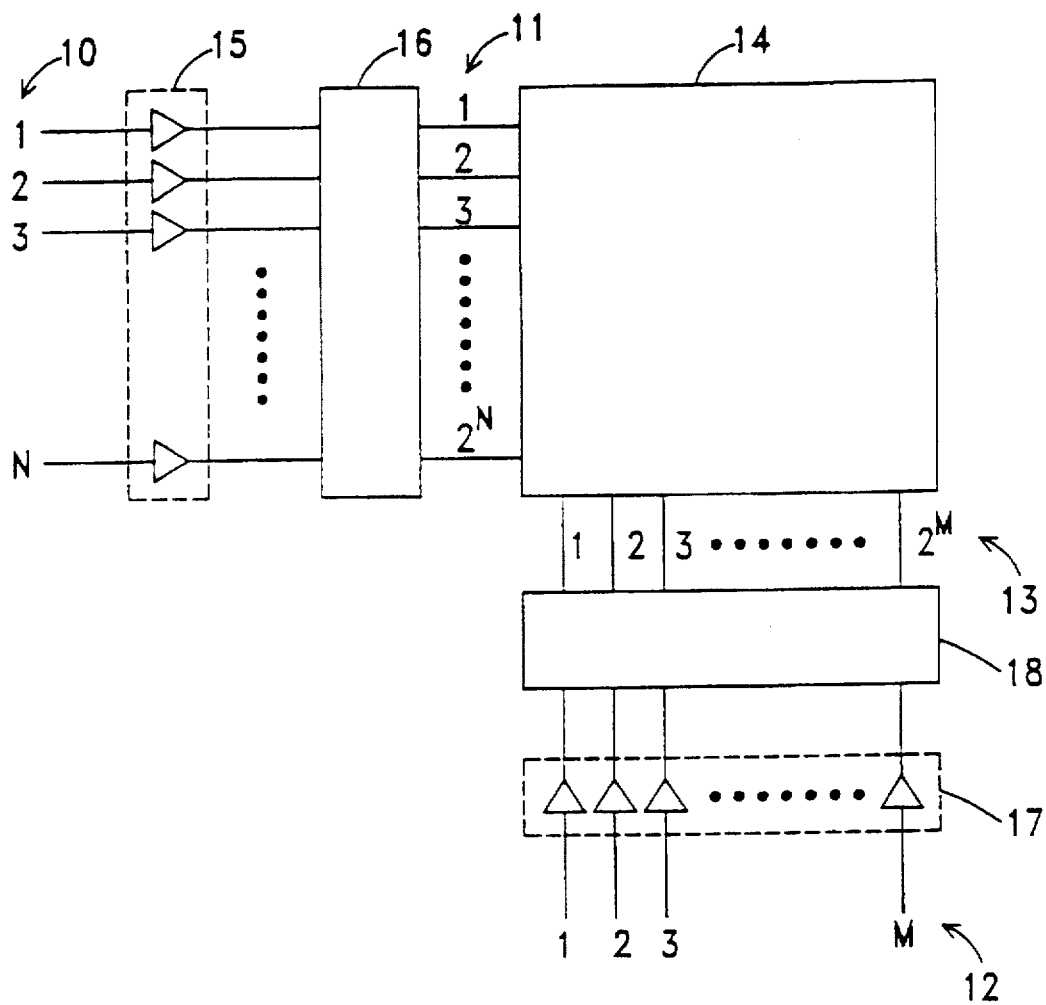
FIG. 1
(Prior Art)
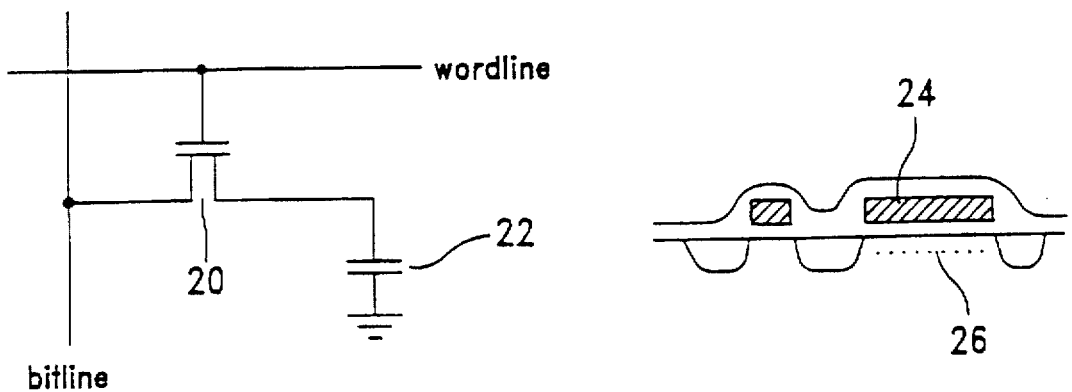
FIG. 2A
(Prior Art)
FIG. 2B
(Prior Art)

LOW POWER PRECHARGE CIRCUIT FOR A DYNAMIC RANDOM ACCESS MEMORY

BACKGROUND OF THE INVENTION

1. Field of the Invention

The present invention relates to a low power dynamic random access memory (DRAM), and particularly to a low power precharge circuit in the DRAM.

2. Description of the Prior Art

Recently, the demand for semiconductor devices, and particularly DRAM, has rapidly increased owing to the widespread use of digital equipment such as computers. FIG. 1 shows a simplified diagram of the organization of a DRAM. Typically, DRAMs comprise a large array of memory storage cells 14 which are arranged in an array including horizontal rows and vertical columns of cells. Horizontal lines (i.e. conductors) which connect all cells in a row are called wordlines 11, and vertical lines (also conductors) which connect all cells in a column are referred to as bitlines 13. Data flows into and out of the cells via those bitlines. Row addresses 10 and column addresses 12 are used to select the appropriate wordlines and bitlines, thus data to be written into or read out of the cells in a required order so far as external processors are concerned (but in a more or less random order from the perspective of the DRAM) can occur quickly and, if need be, at a fixed rate. A row address buffer 15 and a column address buffer 17 respectively receive row address signals 10 and column address signals 12, which are then used for selecting a storage cell in the memory 14. Further, a row decoder 16 and a column decoder 18 are added to decode the row address 10 and the column address 12 into the wordlines 11 and the bitlines 13 respectively, allowing fewer number of address lines to be used for accessing a large number of storage cells in the memory 14. This array configuration of semiconductor memory cells lends itself well to the regular structure preferred in very large scale integration (VLSI) semiconductor fabrication industry.

Dynamic random access memory (DRAM) has become one of the most widely used types of semiconductor memory due to its low cost per bit, high device density and flexibility of use in data reading and writing operations.

U.S. Pat. No. 3,387,286 titled "Field Effect Transistor Memory" by R. H. Dennard describes a DRAM storage cell consisting of one transistor and one capacitor. A circuit schematic diagram of such structure is shown in FIG. 2A. The gate of the transistor 20 is controlled by a wordline signal, and data is written into or read out of the capacitor 22 along with a bitline signal. FIG. 2B shows cross section of a traditional one-transistor DRAM storage cell. A polysilicon layer 24 is used as one plate of the capacitor. The substrate region under the polysilicon plate 24 serves as the other electrode of the capacitor. A voltage is applied to invert this region, forming a depleted region below the substrate surface which is depicted as region 26 in FIG. 2B. In order to keep the memory cells of a same size (so that large numbers of cells can be arranged on a single semicodcutor chip), the size of the capacitors is preferably kept small. As a result of the size constraints, and for other reasons as well, these capacitor typically have a small capacitance (i.e. they can only store a small amount of electrical charge).

FIG. 3 shows the structure of a memory cell array and the peripheral circuits required for reading and writing operations. Each memory cell 30 includes a capacitor 301 which holds a bit of data, and an access transistor 303 which serves as a switch. The gates of the access transistors which are aranged in the same row are connected to a common wordline $WL_x$, where $x=(1, 2, \ldots, n)$. The sources of the access transistors which are arranged in a column are alternately connected to a bitline pair $BL_x$, $BL_x/$, where $x=(1, 2, \ldots, m)$. One electrode of each capacitor 301 is connected to the drain of the corresponding access transistor 303, while the other electrode is connected to ground or a reference voltage.

Before the activation of a wordline and accessing of the memory array, a precharge circuit 32 charges all bitline pairs up to one half of the supply voltage, e.g., ½ Vdd. Further, each bitline pair is shorted or equalized so that the bitlines are at an equal potential. The time required to precharge and equalize is often referred to as precharge time or precharge period.

When a row address is supplied, it is decoded by a row decoder 34 into a row address signal and one wordline is activated corresponding to the decoded row address, thus turning on all the access transistors connected to this wordline. The stored charges on all the capacitors corresponding to this wordline flow onto the bitline pairs. Owing to the relatively low capacitance of the capacitors used in the memory chip, a sense amplifier 36 is used to amplify the slight effects which the charged capacitor has on the bitline pair. The sense amplifier 36 draws the potential of lower-voltage bitline to Vss, and raises the potential of the other higher-voltage bitline up to Vdd. Only one of the amplified signals passes through an I/O gate circuit 37 corresponding to a decoded column address from a column decoder 38.

The precharge circuit 32 is disabled during memory access, that is, the precharge circuit 32 is disabled before wordline is enabled and it stays disabled until after sense amplifier is disabled. During memory access, the sense amplifier 36 forces one bitline to Vdd and the other bitline to Vss. At the end of memory access or when the sense amplifier 36 is disabled, the precharge circuit 32 is activated, forcing its corresponding bitlines to be charged from Vdd and Vss to half Vdd. Because the bitlines themselves have capacitance, the precharge of one bitline from Vdd to half Vdd requires discharge of the bitline to half Vdd. On the other side, precharge of the other bitline from Vss to half Vdd requires charging up of the bitline to half Vdd. A half Vdd voltage generator is used to provide half Vdd voltage for precharging the bitlines. Since there are typically 1024 columns in one sub-array block in most of the present 16 Meg DRAM designs, charging and discharging the bitlines takes, in comparitive terms, a lot of power from the half Vdd voltage generator and also creates much electrical noise when all the columns in one sub-array block are precharged at once.

FIG. 4 shows a conventional precharge/sense amplifier, where three transistors 40, 42 and 44 are used for each column to precharge the bitline pair BL, BL/. Signal VBL, the half Vdd constant voltage source, forces bitline pair BL, BL/ to half Vdd whenever a precharge control signal PRE turns on transistors 42 and 44. The third transistor 40, a so-called equalizer, is also turned on and is used to balance or short the bitline pair BL, BL/ together during the precharge period.

For the following discussion, it is assumed that bitline BL has low voltage and bitline BL/ has high voltage. When signal PRE climbs above the threshold voltage of an N metal-oxide-semiconductor (NMOS) transistor, transistor 42 is turned on and voltage source VBL subsequently precharges the low-voltage bitline BL. In the meantime, the high-voltage bitline BL/ tends to share its charge with the bitline BL since transistor 40 is also turned on at this time. When the voltage of the signal PRE is one threshold voltage higher than that of the voltage source VBL, the transistor 44 is turned on and the high-voltage bitline BL/ discharges to voltage source VBL. Current flowing from and to the voltage source VBL consumes a large amount of the power provided by the voltage source VBL. Further, much noise is introduced due to the charging and discharging which occurs in this circuit.

SUMMARY OF THE INVENTION

In accordance with the present invention, a precharge circuit for a DRAM is provided to substantially save power. The present invention includes an equalization circuit connected to a pair of bitlines for allowing electric charge of the bitline having higher voltage to flow to the bitline having lower voltage after being activated by a precharge control signal. A voltage pull circuit is used to provide a constant voltage in response to a first sense control signal SA_P. Further, a voltage amplifying circuit connected to the pair of bitlines is used to amplify the voltages of the bitlines in response to a second sense control signal SA_N so that the voltage of one bitline is complementary to the voltage of the other bitline. Power is substantially saved because of the charge sharing of the low-voltage bitline with a high-voltage bitline. Further, the constant voltage generator conventionally used in the prior art is eliminated in the present invention, thus substantially reducing memory area and power consumption.

BRIEF DESCRIPTION OF THE DRAWINGS

FIG. 1 shows a simplified diagram of the organization of large semiconductor memories.

FIG. 2A shows a circuit schematic diagram of a dynamic random access memory (DRAM) cell.

FIG. 2B shows cross section of a traditional one-transistor DRAM storage cell.

DESCRIPTION OF THE PREFERRED EMBODIMENT

Figure 3:
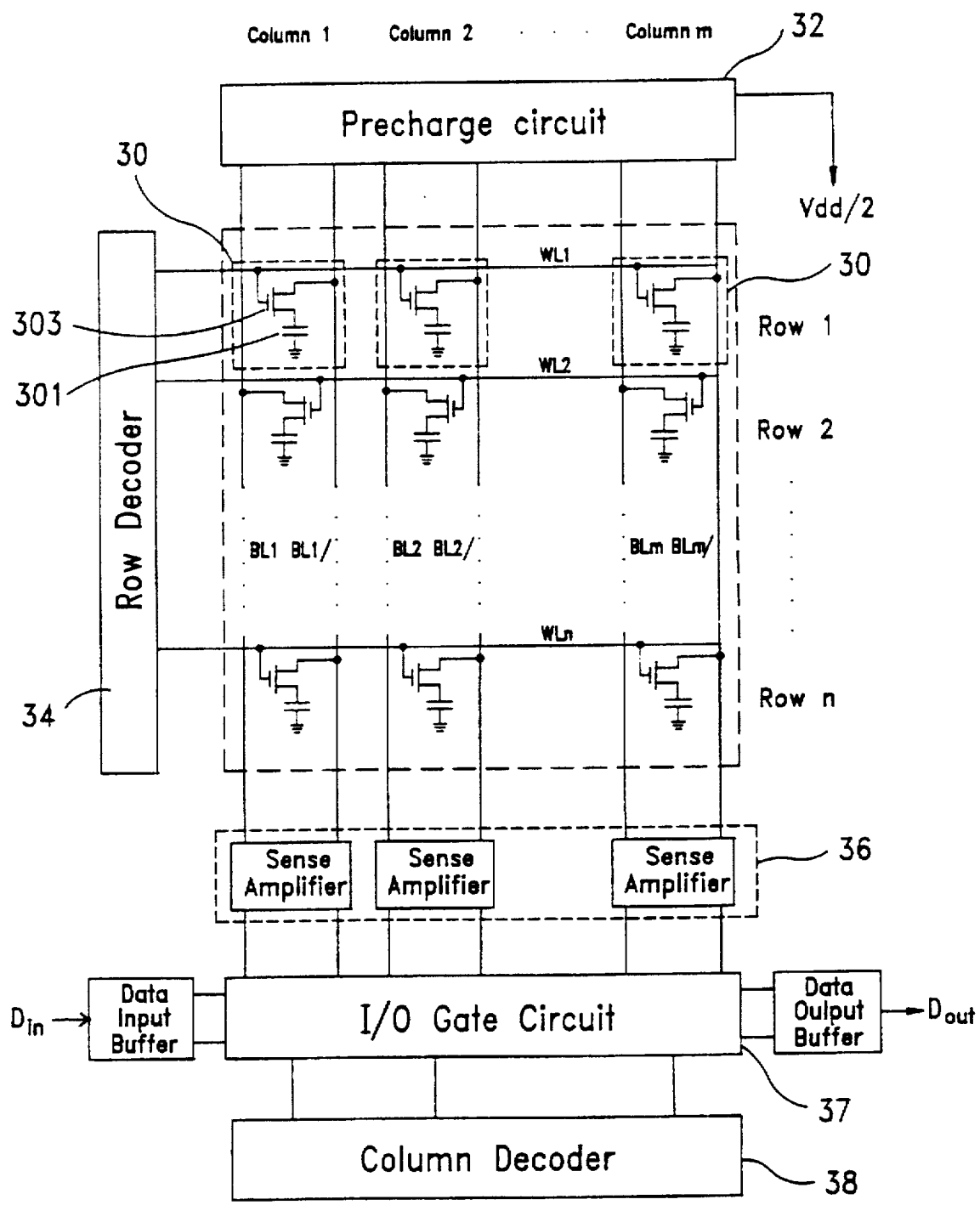
FIG. 3 shows the structure of a memory cell array and the peripherals.
Figure 4:
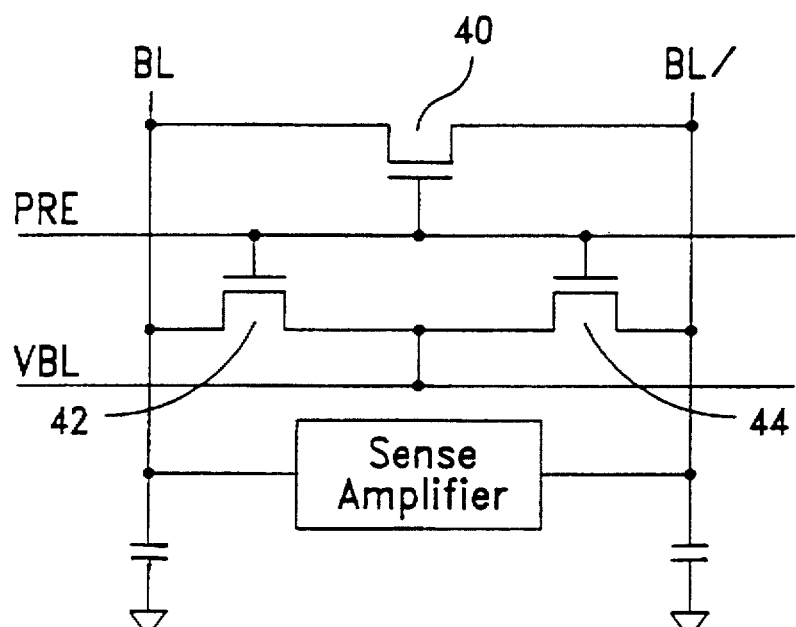
FIG. 4 shows a conventional precharge/sense amplifier.
Figure 5A:
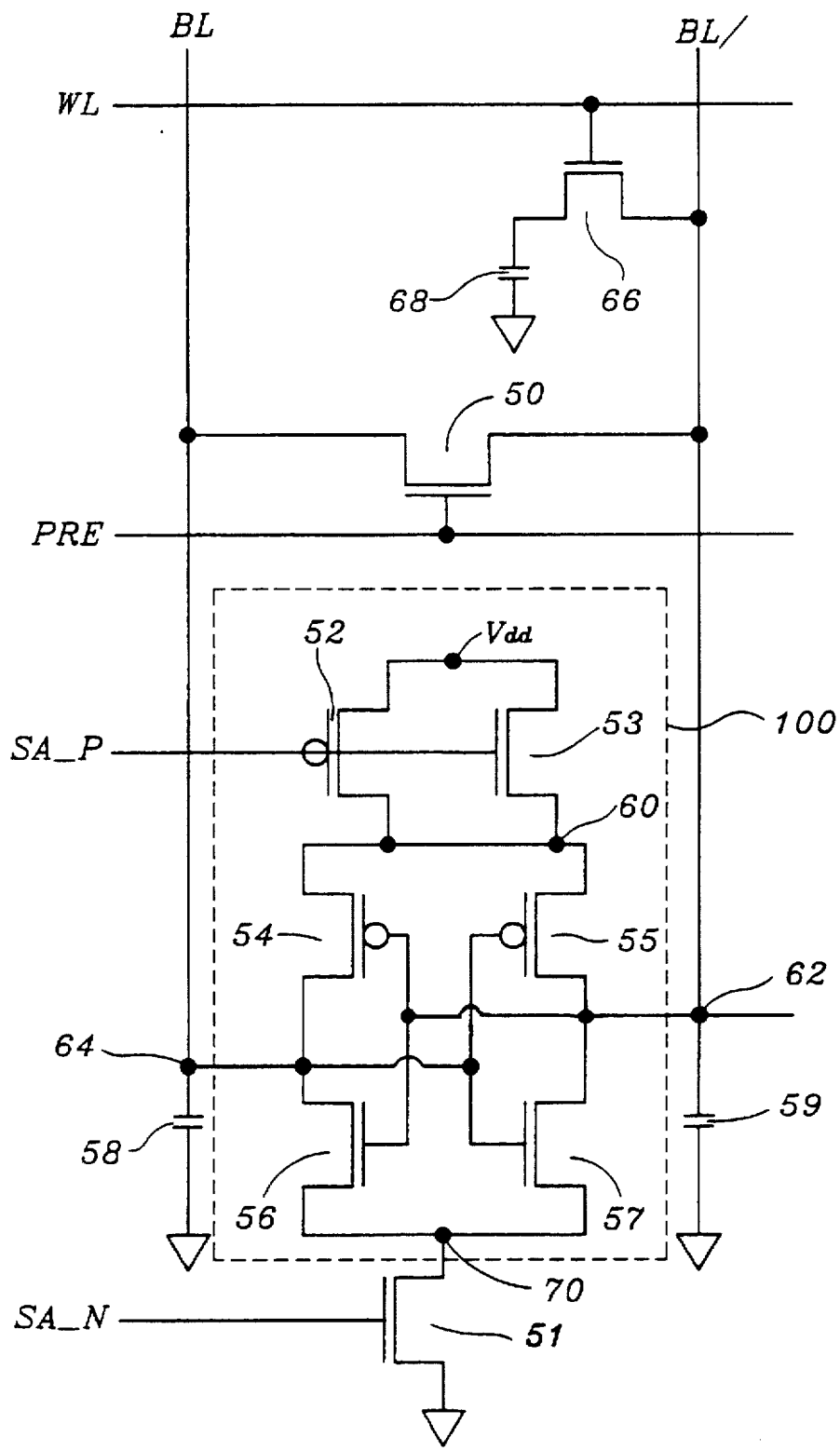
FIG. 5A shows one embodiment of the present invention.
Figure 5B:
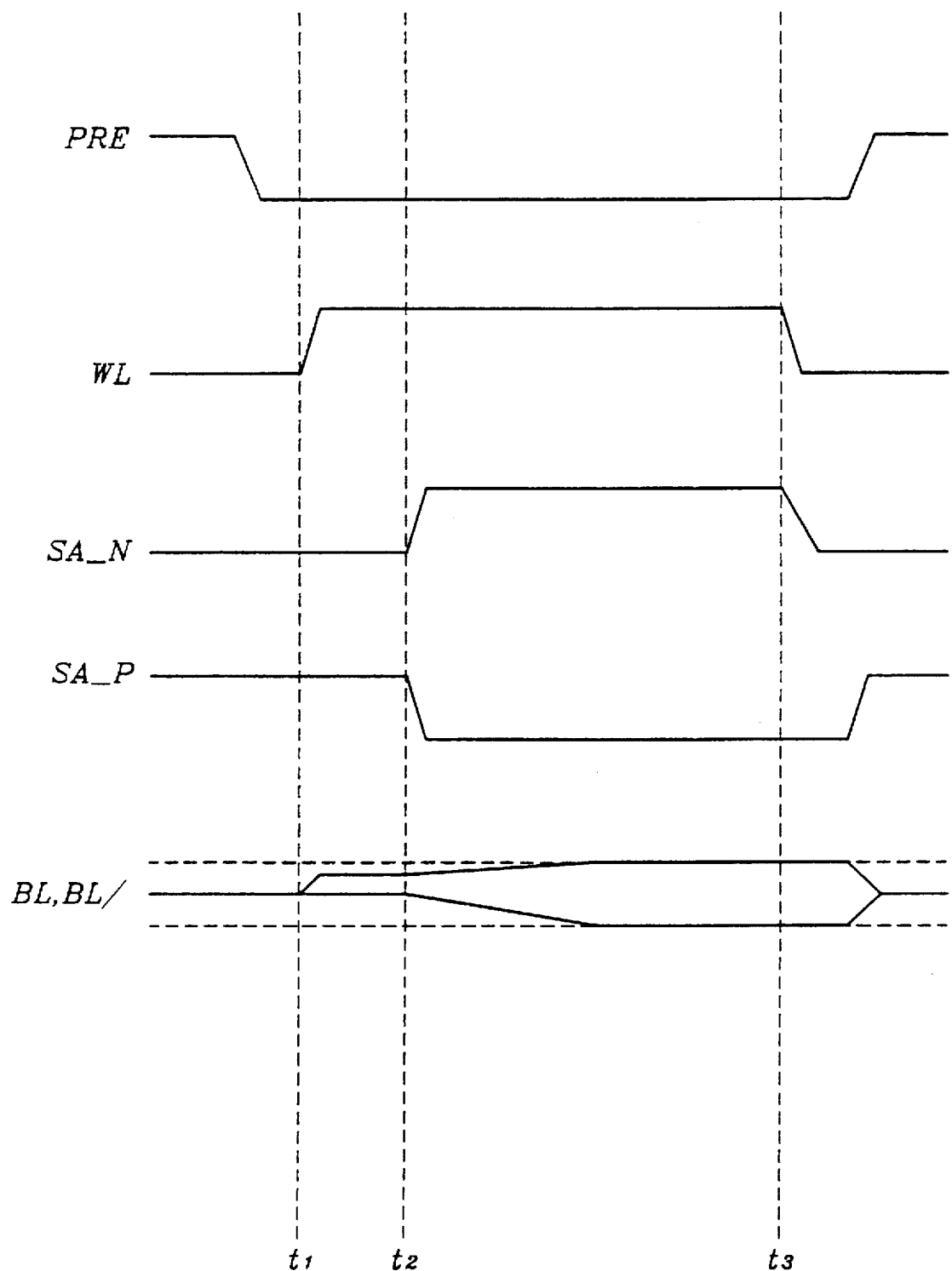
FIG. 5B shows the timing diagram according to the embodiment of the present invention.

FIG. 5A shows one embodiment of the present invention. A corresponding timing diagram is shown in FIG. 5B. Transistor 50, which is referred to as a dumper or an equalizer, is turned on by an active precharge control signal PRE in the beginning of a precharge operation, thus allowing charge on the high-voltage bitline to flow to the low-voltage bitline. Therefore, the charge conventionally flowing in and from the voltage source VBL, as mentioned above in connection with FIG. 4, does not occur, but instead the charges on the bitlines are effectively recycled. The power is substantially saved because of the charge sharing of the low-voltage bitline with a high-voltage bitline. Also, since the parasitic capacitance 58, 59 on the bitlines of the bitline pair BL and BL/ are ideally the same, the resultant potential on both bitlines BL and BL/ is about half Vdd, i.e., half the power supply voltage.

Transistors 52 through 57 constitute a modified sense amplifier 100. The gate electrodes of a transistor 52, which behaves like a P pull transistor, and a transistor 53, which behaves like an N pull transistor, are connected to a sense control signal SA_P. Transistor 53 is turned on by a sense control signal SA_P whenever the sense amplifier is disabled. N pull transistor 53 provides a Vdd–Vtn voltage at node 60, wherein Vtn is the threshold voltage of an NMOS transistor.

A wordline control signal WL from a row decoder becomes active (goes high) at time t1, as is shown by FIG. 5B, when it corresponds to a selected row address, thereby turning on access transistor 66. Consequently, charge stored on capacitor 68 flows onto the bitline BL/, while the voltage on bitline BL keeps unchanged. Owing to the low capacitance of capacitor 68 in a high density memory chip, the slightly different potential between BL and BL/ is then amplified by the modified sense amplifier. Referring again to FIG. 5B, transistor 51 is turned on by an active sense control signal SA_N at time t2 and provides a grounding loop for the modified sense amplifier 100. At the same time t2, the other sense control signal SA_P goes low, turning off the N pull transistor 53 and turning on the P pull transistor 52, so that it functions as a pull-up transistor and provides a Vdd at node 60.

The transistors 54 through 57 constitute a latch circuit connected with the bitline pair BL, BL/ via nodes 62 and 64. Assuming that the memory capacitor 68 in FIG. 5A is stored with high voltage or Vdd voltage, the voltage on BL/ is slightly higher than that of BL at time t2. As the signal SA_P moves to low, the N pull transistor is off and the P pull transistor is on. As a result the voltage at node 60 is Vdd. In the meantime the signal SA_N moves to high turning on the transistor 51 and connecting node 70 to ground. Since the voltage on BL/ is slightly higher than the voltage on BL, the transistor 55 is more conductive than the transistor 54 while the transistor 57 is less conductive than the transistor 56. As a result BL/ is pulled up by the transistor 55 to Vdd and BL is pulled down by the transistor 56 to Vss.

At time t3 the signal SA_N is switching low turning off the sense amplifier and the signal WL is switching low to isolate the access transistors from the bitlines. When the signal PRE goes high to turn on the equalizer for charge recycleing, the signal SA_P switches to high to turn on N pull transistor providing a voltage reference to BL and BL/.

It is noted that the constant voltage generator VBL conventionally used in the prior art is eliminated in the present invention, thus substantially reducing memory area and power consumption.

For the current and future CMOS technology, transistors are fabricated with low leakage currents but the refresh rate of memory cell array is rather high due to disturbance. Therefore, the identical half Vdd voltage on both bitlines made by the equalizing transistor 50 can be sustained by the periodic, and rather high speed refresh operation, that is, the bitline BL, BL/ are equalized and sustained by the present invention every time any memory cell in the memory cell array is refreshed without N pull transistor. Thus, the voltage on the bitlines does not drift assuming that low-leakage transistors attached to the bitlines, and the N pull transistor can be eliminated.

Although a specific embodiment has been illustrated and described, it will be obvious to those skilled in the art that various modification may be made without departing from the spirit which is intended to be limited solely by the appended claims.

What is claimed is:

1. A low power precharge circuit for dynamic random access memory having a plurality of memory cells therein, said precharge circuit comprising:

equalization means connected to a pair of bitlines for allowing an electric charge on the bitline having a higher voltage to flow to the bitline having a lower voltage, said equalization means being activated by a precharge control signal;

voltage pull means for providing a constant voltage in response to a first sense control signal, wherein said voltage pull means comprises a first pull transistor and a second pull transistor, gate electrodes of said first pull transistor and said second pull transistor being connected to the first sense control signal; and voltage amplifying means connected to the pair of bitlines for amplifying the voltages of the bitlines in response to a second sense control signal so that the voltage of one bitline is complementary to the voltage of the other bitline.

2. The low power precharge circuit according to claim 1, wherein said equalization means comprises a field effect transistor, a gate electrode of said first field effect transistor being connected to the precharge control signal.

3. The low power precharge circuit according to claim 1, wherein the voltage of said constant voltage is equal to a supplied drain voltage minus the threshold voltage of the second pull transistor.

4. The low power precharge circuit according to claim 1, wherein said first pull transistor is a p type field effect transistor, and said second pull transistor is an n type field effect transistor.

5. The low power precharge circuit according to claim 1, wherein said voltage amplifying means comprises:

a latch circuit connected to the bitlines, said latch circuit being powered by said constant voltage; and a ground circuit connected to the latch circuit for providing a grounding loop for the latch circuit in response to the second sense control signal.

6. The low power precharge circuit according to claim 1, wherein said latch circuit comprises a pair of transistor circuits cross-connected in series to form said latch circuit, each of said transistor circuits comprising a p type field effect transistor and an n type field effect transistor.

7. A low power precharge circuit for dynamic random access memory having a plurality of memory cells therein, said precharge circuit comprising:

a filed effect transistor connected to a pair of bitlines for allowing electric charge of the bitline having higher voltage to flow to the bitline having lower voltage, said field effect transistor being activated by a precharge control signal;

a voltage pull circuit comprising a first pull transistor and a second pull transistor for providing a constant voltage in response to a first sense control signal, wherein gate electrodes of said first pull transistor and said second pull transistor being connected to said first sense control signal; and voltage amplifying means connected to the pair of bitlines for amplifying the voltages of the bitlines in response to a second sense control signal so that the voltage of one bitline is complementary to the voltage of the other bitline.

8. The low power dynamic random access memory according to claim 7, wherein gate electrode of said field effect transistor being connected to the precharge control signal.

9. The low power dynamic random access memory according to claim 7, wherein the voltage of said constant voltage equals to a supplied drain voltage minus threshold voltage of the second pull transistor.

10. The low power dynamic random access memory according to claim 7, wherein said first pull transistor is a p type field effect transistor, and said second pull transistor is an n type field effect transistor.

11. The low power dynamic random access memory according to claim 7, wherein said voltage amplifying circuit comprises:

a latch circuit connected to the bitlines, said latch circuit is powered by said constant voltage; and a ground circuit connected to the latch circuit for providing a grounding loop for the latch circuit in response to the second sense control signal.

12. The low power dynamic random access memory according to claim 11, wherein said latch circuit comprises a pair of transistor circuits cross-connected in series to form said latch circuit, each of said transistor circuits comprising a p type field effect transistor and an n type field effect transistor.

13. A low power precharge circuit for dymanic random access memory having a plurality of memory cells therein, said precharge circuit comprising:

a filed effect transistor connected to a pair of bitlines for allowing electric charge of the bitline having higher voltage to flow to the bitline having lower voltage, said field effect transistor being activated by a precharge control signal;

voltage pull means for providing a constant voltage in response to a first sense control signal, wherein said voltage pull means comprises a first pull transistor and a second pull transistor, gate electrodes of said first pull transistor and said second pull transistor being connected to the first sense control signal; and voltage amplifying means connected to the pair of bitlines for amplifying the voltages of the bitlines in response to a second sense control signal so that the voltage of one bitline is complementary to the voltage of the other bitline.

14. The low power precharge circuit according to claim 13, wherein gate electrode of said field effect transistor being connected to the precharge control signal.

15. The low power precharge circuit according to claim 13, wherein the voltage of said constant voltage equals to a supplied drain voltage minus threshold voltage of the pull transistor.

16. The lower power precharge circuit according to claim 13, wherein said first pull transistor is a p type field effect transistor, and said second pull transistor is an n type field effect transistor.

17. The low power precharge circuit according to claim 13, wherein said voltage amplifying circuit comprises:

a latch circuit connected to the bitlines, said latch circuit is powered by said constant voltage; and a ground circuit connected to the latch circuit for providing a grounding loop for the latch circuit in response to the second sense control signal.

18. The low power precharge circuit according to claim 17, wherein said latch circuit comprises a pair of transistor circuits cross-connected in series to form said latch circuit, each of said transistor circuits comprising a p type field effect transistor and an n type field effect transistor.

* * * * *